Oct. 25, 1966 CHIKARA HIRAYAMA ETAL 3,281,270
GLASS COMPOSITION AND THERMOELECTRIC ELEMENT COATED THEREWITH
Filed Oct. 22, 1962
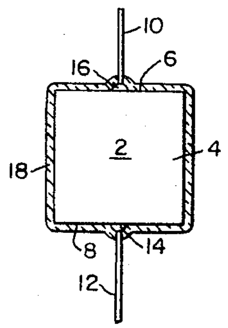
WITNESSES:
Bernard R. Giegucz
Raymond F. Majesko
INVENTORS
Chikara Hirayama and
Herbert L. Taylor.
BY
C. L. Menzemer
ATTORNEY

United States Patent Office 3,281,270

Patented Oct. 25, 1966

3,281,270

GLASS COMPOSITION AND THERMOELECTRIC ELEMENT COATED THEREWITH

Chikara Hirayama and Herbert L. Taylor, Franklin Township, Westmoreland County, Pa., assignors to Westinghouse Electric Corporation, East Pittsburgh, Pa., a corporation of Pennsylvania Filed Oct. 22, 1962, Ser. No. 232,086
8 Claims. (Cl. 136—232)

The present invention relates to inorganic high temperature encapsulating materials for semiconductor members.

Heretofore, it has been known that certain semiconductor members, especially thermoelectric elements, often require encapsulation for operation at high temperatures, for example above 500° C., in order to inhibit losses of the thermoelectric materials which comprise the elements by vaporization. These losses lead to the deterioration of the elements upon prolonged heating at the elevated temperatures. It was also known that unencapsulated thermoelectric materials deteriorate rapidly when heated to the high operational temperatures in certain atmospheres. For example, lead telluride is unstable in air at temperatures higher than about 450° C., and germanium bismuth telluride is unstable in argon at temperatures approaching 550° C.

It is generally required that the encapsulating material be nonreactive with the thermoelectric materials comprising the elements and that they be applicable in continuous thin films so as to minimize thermal losses. It is preferred that the encapsulating material be easily applicable to the elements without the use of complex apparatus. Moreover, it is highly desirable that, the encapsulation be nonporous, so that it may effectively inhibit vaporization of the thermoelectric elements. Finally, it is desirable that the thermal expansion of the encapsulating material be the same or slightly lower than that of the thermoelectric element in order to place the latter under compressive stress. For example, the linear expansion coefficient of the presently used thermoelectric generation materials is of the order of $18\times10^{-6}$/° C. Therefore, the encapsulating material should have a linear expansion coefficient in the neighborhood of $17\times10^{-6}$/° C.

An object of the present invention is to provide a nonporous encapsulating material for thermoelectric elements capable of inhibiting vapor losses in the thermoelectric material comprising the elements at elevated temperatures and having a relatively tight adherence to the thermoelectric element at all temperatures, the linear coefficient expansion of the material being substantially similar to that of the element.

Another object of the invention is to provide an inorganic encapsulating material suitable for use on semiconductor devices comprising predetermined proportions of sodium-alumino phosphate glass, crystalline silica and/or zirconium silicate and colloidal alumina, with or without colloidal silica.

Other objects of the invention will, in part be obvious and will in part, appear hereinafter.

The invention will be described in greater detail by reference to the accompanying drawing, the single figure of which is an elevation view of the thermoelectric element of the invention.

In accordance with the present invention and in attainment of the foregoing objects there is provided an inorganic non-porous encapsulating material for semiconductor members comprising by weight 25 to 80% of sodiumalumino phosphate glass, 30 to 70% of at least one material selected from the group consisting of crystalline silica and zirconium silicate, 0.5 to 3% of colloidal alumina, and 0 to 2% of colloidal silica with up to 1% of non-deleterious impurities, such as magnesium oxide, calcium or aluminium silicate and chromic oxide. In a preferred embodiment, the encapsulating material comprises by weight 50 to 70% of sodiumalumino phosphate glass, 30 to 50% of at least one material selected from the group consisting of crystalline silica and zirconium silicate and 0.5% to 1.5% of colloidal alumina with up to 1% of non-deleterious impurities.

It is desirable that the encapsulating material be able to withstand operating temperatures between 350° C. and 600° C. without fusing and thereby facilitating disintegration of the thermoelectric elements. Accordingly, the fusion temperature of the encapsulating material may be appropriately adjusted to satisfy the requirements dictated by the operation temperature of the thermoelectric element. For example, decreasing the proportion of the sodiumalumino phosphate glass to a lower percentage in its compositional range and concurrently increasing the proportion of the crystalline silica, and/or zirconium silicate raises the fusion temperature of the encapsulating material. The increase in the fusion temperatures is caused by the partial dissolution of the crystalline silica and/or zirconium silicate in the phospate glass. The undissolved crystalline silica or zirconium silicate acts as a filler which tends to match the expansion coefficient of the encapsulating material with that of the thermoelectric element.

The encapsulating materials of the invention have a linear expansion coefficient of approximately $17\times10^{-6}$/° C. which is comparable to that of the known thermoelectric generation materials now in use.

The colloidal alumina is essential as a suspending agent, which, when combined with the phosphate glass and crystalline silica provides a homogeneous slurry which can be applied to a thermoelectric element as a thin continuous film. The colloidal alumina also serves as a binder together with the phosphate glass so that the encapsulating material has sufficient mechanical strength for handling upon drying at 100° C. The colloidal silica is also a suspending agent and may be employed in combination with colloidal alumina if desired.

In a particular embodiment of the invention, the encapsulating material comprises about 66% by weight of sodiumalumino phosphate glass, a total of 33% by weight of at least one of crystalline silica and zirconium silicate and 1% by weight of colloidal alumina.

The encapsulating material may be prepared by hydrating a mixture of weighed proportions of the components and ball milling the same for a satisfactory period of time to provide a smooth consistency of material and a uniform dispersion of components.

Referring to the figure, there is shown a thermoelectric element 2 comprising a body 4 of thermoelectric material having end surfaces 6 and 8. Electrical contacts 10 and 12 may be joined to end surfaces 6 and 8 by means of solder 14 and 16. A relatively thin coating 18 of an inorganic encapsulating material is applied on the exposed surfaces of the body 4 to prevent vaporization of the body.

In certain operational environments it is desirable to coat the thermoelectric element, for example, a lead telluride thermoelectric element with a base coating before applying the encapsulating material described herein. A suitable base coating comprises by weight at least 30% of lead glass, 30 to 70% of crystalline silica, 0.5 to 5% of colloidal alumina and 0 to 3% colloidal silica with up to 1% of non-deleterious impurities. The base coating is described more fully in copending application Serial No. 232,087 assigned to the assignee of the present invention.

The following examples are illustrative of the teachings of the invention.

*Example I*

An encapsulating composition of this invention was prepared by mixing 40 grams of sodiumalumino phosphate glass, 20 grams of 200 mesh crystalline silica and 0.5 gram of colloidal alumina with sufficient water to form a slurry and ball milling the mixture for approximately one hour to obtain a smooth and consistent slurry.

The composition of the sodiumalumino phosphate glass employed herein comprised 3.7% lithium oxide, 22.8% sodium oxide, 20.5% aluminum oxide, 7.2% boron oxide, 1.3% silicon dioxide, 44.5% phosphorus pentoxide and 4.7% fluoride. It should be appreciated however that other low melting compositions of sodiumalumino phosphate glasses may also be used.

Germanium telluride and germanium bismuth telluride thermoelectric elements were brush coated with the prepared slurry material and allowed to dry in an oven at a temperature of about 150° C. The units were then placed in a furnace and heated at 450° for about thirty minutes. The temperature was subsequently raised to 575° C. and held at that temperature for five to ten minutes.

The elements were furnace cooled to room temperature. However, the elements also may be removed from the furnace immediately and air cooled without cracks occurring in the encapsulating material coating. The elements were tested by heating them at 600° C. in an argon atmosphere for 780 and 1046 hours. After such prolonged heating the elements had a negligible weight loss and change in resistance. Also, the coating appeared to be tightly adherent to the element and non-porous.

The results of the weight loss tests for some of the germanium bismuth telluride elements are shown in Table I.

TABLE I.—WEIGHT LOSS OF ELEMENTS

| Temp., ° C. | Atmos. | Total Time, hr. | Initial Weight (gm.) | Final Weight (gm.) |
|---|---|---|---|---|
| 600 | Argon | 1046 | 5.0 | 5.0 |
| 600 | Argon | 780 | 4.98 | 4.5 |
| 600 | Argon | 780 | 5.70 | 5.65 |

*Example II*

An encapsulating composition of this invention was prepared by mixing 50 parts of 200 mesh zirconium silicate and 50 parts of sodiumalumino phosphate glass with sufficient water to form a slurry and ball milling the mixture to obtain a smooth and consistent slurry. Germanium bismuth telluride thermoelectric elements were brush coated with the prepared slurry material and allowed to dry in an oven at a temperature of about 100° C. The unit was then heated in a furnace at 550° C. for 10 to 30 minutes in air. On further heating the encapsulated elements at 600° C. in argon for extended periods, the thermoelectric elements did not deteriorate.

It should be understood that the foregoing description is intended to be illustrative and not limiting.

We claim as our invention:

1. An inorganic material suitable for encapsulating a semiconductor element comprising by weight 25 to 80% of sodiumalumino phosphate glass, 30 to 70% of at least one material selected from the group consisting of zirconium silicate and crystalline silica, 0.5 to 3% of colloidal alumino and 0 to 2% of colloidal silica with up to 1% of non-deleterious impurities.

2. An inorganic encapsulating material suitable for use on semiconductor devices comprising by weight 50 to 70% of sodiumalumino phosphate glass, 30 to 50% of at least one material selected from the group consisting of crystalline silica and zirconium silicate, and 0.5 to 1.5% of colloidal alumina.

3. An inorganic encapsulating material for a thermoelectric element comprising by weight 50 to 70% of sodiumalumino phosphate glass, 30 to 50% of a material selected from the group consisting of crystalline silica and zirconium silicate, and 0.5 to 1.5% of colloidal alumina, the material being capable of withstanding effectively temperatures up to the operating temperature of the thermoelectric element.

4. An encapsulating material for germanium telluride and germanium bismuth telluride thermoelectric elements comprising 50 to 70% of sodiumalumino phosphate glass, 30 to 50% of crystalline silica, and 0.5 to 1.5% of colloidal alumina.

5. An encapsulating material for germanium telluride and germanium bismuth telluride elements comprising 50 to 70% of sodiumalumino phosphate glass, 30 to 50% of zirconium silicate, and 0.5 to 1.5% of colloidal alumino.

6. An encapsulating material for germanium telluride and germanium bismuth telluride thermoelectric elements comprising by weight about 66% of sodiumalumino phosphate glass, 33% of crystalline silica, and 1% of colloidal alumina.

7. A thermoelectric element comprising a shaped body of thermoelectric material having end surfaces, electrical contacts joined to the end surfaces and a tightly adherent relatively thin coating of an inorganic encapsulating material disposed on the exposed surfaces of the thermoelectric body, the encapsulating material comprising by weight 25 to 80% of sodiumalumino phosphate glass, 30 to 70% of at least one material selected from the group consisting of zirconium silicate and crystalline silica, 0.5 to 3% of colloidal alumina, and 0 to 2% of colloidal silica.

8. A thermoelectric element comprising a shaped body of thermoelectric material having end surfaces, electrical contacts joined to the end surfaces and a tightly adherent, relatively thin coating of an inorganic encapsulating material disposed on the exposed surfaces of the thermoelectric body, the encapsulating material comprising by weight 50 to 70% of sodiumalumino phosphate glass, 30 to 50% of at least one material selected from the group consisting of crystalline silica and zirconium silicate, and 0.5 to 1.5% of colloidal alumina.

References Cited by the Examiner

UNITED STATES PATENTS 2,800,414 7/1957 Stradley et al. -------- 106—48
3,170,813 2/1965 Duncan et al. ------ 136—4 X WINSTON A. DOUGLAS, *Primary Examiner.*
ALLEN B. CURTIS, *Examiner.*